(12) United States Patent
Howard et al.

(10) Patent No.: US 8,803,620 B2
(45) Date of Patent: Aug. 12, 2014

(54) WIDEBAND SMALL-SCALE CAVITY OSCILLATOR

(71) Applicant: Electromagnetic Technologies Industries, Inc., Boonton, NJ (US)

(72) Inventors: John Howard, Upper Mount Bethel, PA (US); Jennifer Howard, Upper Mount Bethel, PA (US)

(73) Assignee: John Howard, Upper Mount Bethel, PA (US)

(*) Notice: Subject to any disclaimer, the term of this patent is extended or adjusted under 35 U.S.C. 154(b) by 57 days.

(21) Appl. No.: 13/622,522

(22) Filed: Sep. 19, 2012

(65) Prior Publication Data

US 2014/0077889 A1 Mar. 20, 2014

(51) Int. Cl.
*H03B 7/14* (2006.01)

(52) U.S. Cl.
USPC ............................ 331/115; 331/107 T

(58) Field of Classification Search
USPC ......... 331/115, 107 T, 132, 96, 117 D, 107 G
See application file for complete search history.

(56) References Cited

U.S. PATENT DOCUMENTS 4,851,271 A * 7/1989 Moore et al. ............... 428/34.5

OTHER PUBLICATIONS

Howard et al., "Evanescent Mode Filter: Design and Implementation", Microwave Journal, pp. 121-135 (Oct. 1989).
Craven et al., "The Design of Evanescent Mode Waveguide Bandpass Filters for a Prescribed Insertion Loss Characteristic", IEEE Transactions on Microwave Theory and Techniques, vol. MTT-19, No. 3, pp. 295-308 (Mar. 1971).
Pence et al., "Broad-Band Equivalent-Circuit Determination of Gunn Diodes", IEEE Transactions on Microwave Theory and Techniques, vol. MTT-18, No. 11, pp. 784-790 (Nov. 1970).
Howard et al., "Simplified Method Eases the Design of Bandpass Filters: A Method to Simplify the Design of Evanescent-Mode Waveguide Bandpass Filters is a New Twist on Previously Established Theory", Microwaves & RF, pp. 97,98, 230, 232 (Dec. 2000).

* cited by examiner

*Primary Examiner* — Joseph Chang
(74) *Attorney, Agent, or Firm* — Hoffmann & Baron, LLP

(57) ABSTRACT

A wideband small-scale cavity oscillator includes a single resonating chamber, a negative resistance diode, at least one capacitive waveguide obstacle, and a tap. The single resonating chamber includes a length, width, and height. The length is greater than the width and height. The negative resistance diode is centrally disposed in the single resonating chamber, and the at least one capacitive waveguide obstacle is disposed in the single resonating chamber. The tap is disposed along the length of the single resonating chamber. A method of manufacturing a wideband small-scale cavity oscillator is provided, which includes providing a single resonating chamber including a length, width, and height, disposing a negative resistance diode centrally in the single resonating chamber, disposing at least one capacitive waveguide obstacle in the single resonating chamber, and disposing a tap along the length of the single resonating chamber.

21 Claims, 3 Drawing Sheets

WIDEBAND SMALL-SCALE CAVITY OSCILLATOR

BACKGROUND

1. Field

The disclosure generally relates to microwave components, and more particularly relates to a wideband small-scale cavity oscillator and its design.

2. Related Art

Filters are an integral part of any communication or electronic warfare system. Filters are used extensively in electronic countermeasures, electronic counter countermeasures, instrumentation, and terrestrial and satellite communications.

There are numerous types of filters that can be used at microwave frequencies. Depending on the transmission medium used, examples include coaxial-type, cavity, stripline, microstrip and waveguide filter. When a system designer requires high-Q or low loss, waveguide filters are preferred. However, the disadvantage of a waveguide filter is its large size at lower microwave frequencies.

Propagating waveguide cavity oscillators are typically large and heavy, which is inconvenient for many end applications. This issue has been partially addressed by existing evanescent cavity oscillators that reduce the overall size of waveguide cavity oscillators. However, many propagating waveguide cavity oscillators utilize more than one cavity having additional resonating chambers that add substantial area to the overall footprint of the resulting device.

SUMMARY

In accordance with one embodiment, a wideband small-scale cavity oscillator is provided, which includes a single resonating chamber, a negative resistance diode, at least one capacitive waveguide obstacle, and a tap. The single resonating chamber includes a length, width, and height. The length is greater than the width and height. The negative resistance diode is centrally disposed in the single resonating chamber, and the at least one capacitive waveguide obstacle is disposed in the single resonating chamber. The tap is disposed along the length of the single resonating chamber.

The cavity oscillator is representable below a cutoff frequency by an equivalent circuit comprising a combination of lumped inductances. The equivalent circuit may include a plurality of quarter-wavelength sections, each of which may include a series inductance and a plurality of shunt inductances. The required capacitive obstacle in an evanescent waveguide may include at least one of a tuning screw and varactor diode disposed through the single resonating chamber, or only the diode. The tap may include a wire output coupler or coupled hole, and the tap may be centrally disposed along the length of the single resonating chamber. The single resonating chamber is evanescent.

In accordance with another embodiment, a method of manufacturing a wideband small-scale cavity oscillator is provided, which includes providing a single resonating chamber including a length, width, and height, disposing a negative resistance diode centrally in the single resonating chamber, disposing at least one capacitive waveguide obstacle in the single resonating chamber, and disposing a tap along the length of the single resonating chamber. The length is greater than the width and the height.

The method may include representing the cavity oscillator below a cutoff frequency by an equivalent circuit including a combination of lumped inductances, wherein the equivalent circuit includes a plurality of quarter-wavelength sections. Each of the quarter-wavelength sections includes a series inductance and a plurality of shunt inductances. The method may include representing the negative resistance diode by at least one of the plurality of shunt inductances, which resonates with the plurality of quarter-wavelength sections, and disposing at least one of a tuning screw and varactor diode through the single resonating chamber. The at least one of a tuning screw and varactor diode is configured to tune the at least one capacitive waveguide obstacle. The method may include disposing the tap centrally along the length of the single resonating chamber.

Other features of the disclosed embodiments will become apparent from the following detailed description considered in conjunction with the accompanying drawings. It is to be understood, however, that the drawings are designed as an illustration only and not as defining any limits of the invention.

DETAILED DESCRIPTION

In communication devices that operate above 2 GHz, transmitter and receiver oscillators may include metal encapsulated cavities that serve to stabilize a free running, active oscillating device, such as a Gunn diode. In general, such cavities support oscillation of the active device at a single frequency, which is determined by the inside dimensions of the cavity, the dimensions and material of purposely inserted tuning elements, and to some extent, characteristics of a load.

Through the use of tuning elements that can be inserted into the cavity, the frequency can be preselected very accurately as appropriate to accommodate given system requirements. Unfortunately, temperature variations cause this frequency to drift. In particular, the material that defines the cavity will expand or contract slightly with temperature changes. Also, the active device itself will vary its activity somewhat with temperature variations, as will the load characteristics. All of these changes cause a resultant change in the oscillation frequency, and thereby degrade the performance of the device.

Two potential solutions can address this problem in microwave cavity oscillators. The first is to specifically design the oscillator for a given tightly limited frequency range, through choice of materials and mechanical connections. In this way, an oscillator can be designed to remain acceptably stable over a workable temperature range. A potential disadvantage to this approach is the limited tuning range of the resultant oscillator. In addition to increased costs of design and construction to match each desired tuning range to acceptable temperature performance, the manufacturer, distributors, and users of such oscillators must maintain a large inventory of oscillators, since they must be able to accommodate needs over a wide frequency range.

The second approach requires external frequency detection circuitry to monitor for drift and to use this information in a feedback loop to control the frequency of oscillation accordingly. However, this approach represents a more costly alternative in frequency bands above 20 GHz.

Figure 1A:
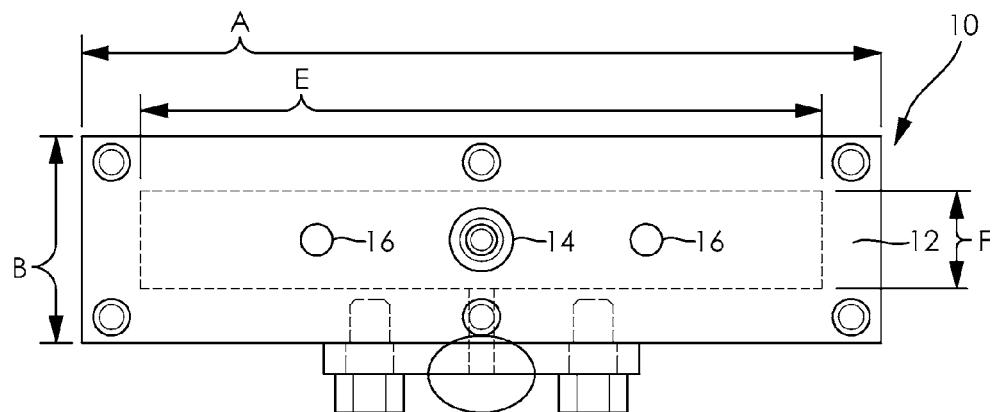
FIG. 1A is a top view of a wideband small-scale cavity oscillator in accordance with a first embodiment.
Figure 1B:
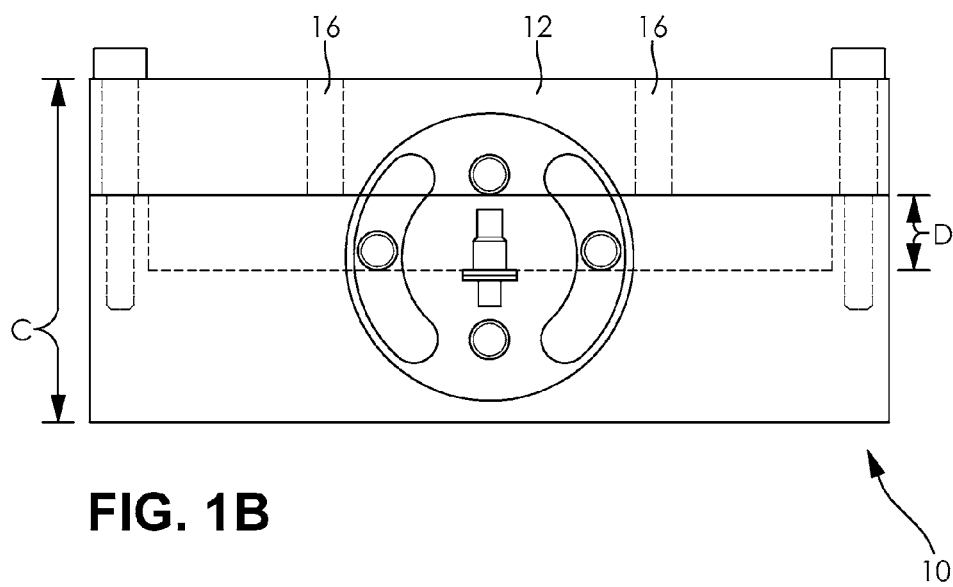
FIG. 1B is a side view of the wideband small-scale cavity oscillator shown in FIG. 1A.

A wideband small-scale cavity oscillator 10 is shown in FIGS. 1A and 1B. FIG. 1A shows a top view of the cavity oscillator 10, and FIG. 1B shows a side view of the cavity oscillator 10. The cavity oscillator 10 utilizes a single evanescent resonating chamber 12 to realize a compact high-Q evanescent waveguide filter. The cavity oscillator 10 includes a negative resistance diode 14, resonating chamber 12, one or more capacitive waveguide obstacles 16, and a coaxial launch, output, or tap 15 directed from a side and/or middle of the cavity oscillator 10, as shown in FIG. 1A. A length A of the cavity oscillator 10 including the metal housing may be 1.75 inches, a width B of the cavity oscillator 10 including the metal housing may be 0.464 inches, a length E of the resonating cavity may be 1.50 inches, a width F of the resonating cavity may be 0.264 inches, a height C of the cavity oscillator including the metal housing may be 0.750 inches, and a height D of the resonating cavity may by 0.171 inches. Dotted lines in FIGS. 1A and 1B represent the resonating cavity or chamber within the cavity oscillator 10, and solid lines in FIGS. 1A and 1B represent the metal housing of the cavity oscillator 10.

Figure 2:
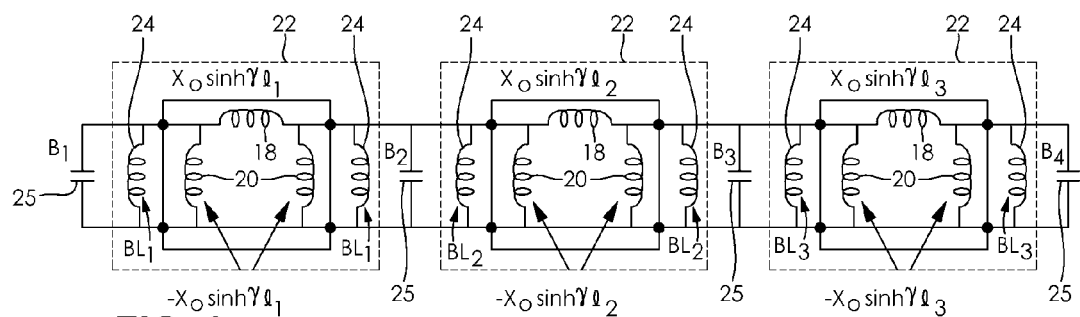
FIG. 2 is a circuit representation of an evanescent mode waveguide filter represented by Craven and Mok, from which is derived the wideband small-scale cavity oscillator shown in FIG. 1A.
Figure 3:
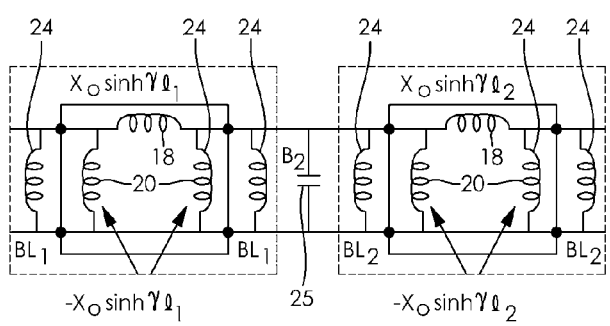
FIG. 3 is a first equivalent circuit representation of the wideband small-scale cavity oscillator shown in FIGS. 1A and 1B below cutoff frequency.

An evanescent transverse-electric (TE) mode of the evanescent waveguide filter enables an analysis of the cavity oscillator 10 based on its representation as a combination of lumped inductances below a cutoff frequency, as shown in a circuit 17 of FIG. 2. The evanescent waveguide 17 is divided into quarter-wavelength sections 22, each of which includes a series inductance 18 and a plurality of shunt inductances 20, 24. Capacitances B1-B4 represent capacitances that generates resonance with the inherently inductive waveguide sections on either side of the capacitances B1-B4. Resonant conditions of the equivalent circuit 17 shown in FIG. 2 are represented by the following equation:

$$B = B_0(coth\gamma l_1 + coth\gamma l_2) \quad (1),$$

where $l_1$ and $l_2$ represent the length of the waveguide sections on either side of the shunt capacitor (which is shown in FIG. 3, however, for the oscillator embodiment disclosed herein, the approximation represented by equation (2) is used), $\gamma$ represents a complex propagation constant (the complex propagation constant describes the amplitude and phase change that a wave undergoes as the wave propagates, a representative value for which is 0.27 mm$^{-1}$), B represents a shunt susceptance (which is the imaginary part of admittance, or inverse of impedance, and is that quantity in parallel to the rest of the circuit, a representative value for which is 0.062 Siemens), and $B_0$ represents a characteristic susceptance (which is the imaginary part of the inverse of the characteristic impedance, and describes the propagation of a single electromagnetic wave along a waveguide, a representative value for which is 0.031 Siemens).

Assuming that the lengths of the quarter wavelength sections 22 are equal, equation (1) is approximated by the following equation:

$$B = 2B_0 \quad (2).$$

The value of the inductances 18, 20, 24 may be calculated by finding a characteristic impedance of two (2) of the quarter-wavelength waveguide sections 22 in accordance with the following equation:

$$Z_0 = \frac{j120\pi b}{a\left(\sqrt{\frac{\lambda}{\lambda_c}}\right)^2 - 1} = \frac{1}{B_0}, \quad (3)$$

where a represents a cross-sectional width B of the single resonating chamber 12 shown in FIGS. 1A and 1B, b represents a cross-sectional height of the single resonating chamber 12, $\lambda$ represents a free-space wavelength (which is the wavelength of an electromagnetic wave if it were traveling in free space; for example, for a 24 GHz wave, the free-space wavelength will be 12.5 mm), and $\lambda_c$ represents a cutoff wavelength (which is the threshold wavelength that determines propagation in a waveguide, if an electromagnetic wave enters with a wavelength greater than this value, the wave will propagate through; and if an electromagnetic wave enters with a wavelength less than this value, the wave will not propagate and will become evanescent; a representative value for which is 10.8 mm)

Each quarter-wavelength waveguide section 22 acts as an inverter. Thus, if a load is shorted, a characteristic impedance of the transmission line becomes zero. Conversely, if the load is open, the characteristic impedance of the transmission line becomes infinite. FIG. 3 shows two (2) of the three (3) quarter wavelength waveguide sections 22 shown in FIG. 2.

Figure 4:
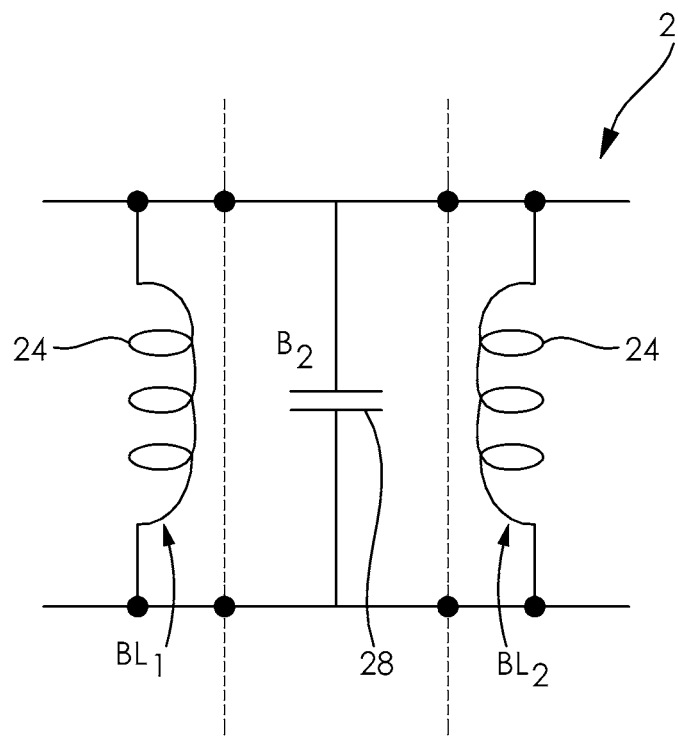
FIG. 4 is a second equivalent circuit representation of the wideband small-scale cavity oscillator shown in FIGS. 1A and 1B below cutoff frequency.
Figure 5:
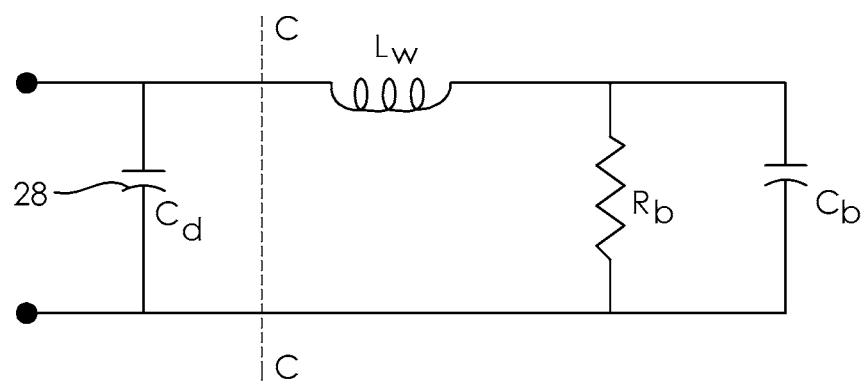
FIG. 5 is a partial equivalent circuit representation of the wideband small-scale cavity oscillator shown in FIGS. 1A and 1B below cutoff frequency.

If outside shunt capacitors 25 are shorted, the transmission line behaves like an open circuit. The resulting equivalent circuit 26 is shown in FIG. 4. A shunt capacitance 28 is introduced in the equivalent circuit 26 shown in FIG. 4 by the negative resistance diode 14 shown in FIGS. 1A and 1B. For example, an equivalent circuit for a Gunn diode is shown in FIG. 5. The negative resistance diode contributes the shunt capacitance to the circuit, which resonates with the waveguide sections. In this manner, the cavity oscillator 10 is realized using a single resonating cavity. By operating below cutoff frequency, the cavity oscillator 10 is smaller in size and remains stable across a wide band of frequencies.

The oscillator 10 is tuned by adding capacitive waveguide obstacles 16 shown in FIGS. 1A and 1B. These capacitive waveguide obstacles 16 may be passive or active. For example, the capacitive waveguide obstacles 16 may include a mechanical tuning screw or varactor diode disposed through a side of the cavity oscillator 10 directly into the resonating chamber 12.

The output of the cavity oscillator 10 is provided from the side of the waveguide, which is in contrast with conventional waveguides that provide an output from an end of the waveguide. The output tap 15 may include a wire output coupler.

Cavity oscillators that utilize a propagating resonating chamber require a larger chamber when compared with the evanescent chamber utilized in the disclosed embodiments. Cavity oscillators that utilize evanescent chambers in addition to a main resonating chamber to improve quality are unable to operate with only a single, evanescent resonating chamber as in the disclosed embodiments. In addition, conventional cavity oscillators typically dispose a wire launch from the end of the waveguide rather than the center of the cavity oscillator as in the disclosed embodiments. Yet further, the disclosed embodiments utilize a diode centrally disposed in the resonating chamber.

Thus, the disclosed embodiments relate to the design of a cavity oscillator in terms of the length of its evanescent resonant cavity and the central location of the wire launch and diode. The positions of the capacitive obstacles are related to a complex propagation constant, the waveguide cross-sectional dimensions, and the desired resonator frequency band.

Although illustrative embodiments of the present invention have been described herein with reference to the accompanying drawings, it is to be understood that the invention is not limited to those precise embodiments, and that various other changes and modifications may be affected therein by one skilled in the art without departing from the scope or spirit of the invention.

What is claimed is:

1. A wideband small-scale cavity oscillator comprising:
   a single resonating chamber, the single resonating chamber comprising a length, width, and height, the length being greater than the width, the length being greater than the height;
   a negative resistance diode, the negative resistance diode being centrally disposed in the single resonating chamber;
   at least one capacitive waveguide obstacle, the at least one capacitive waveguide obstacle being disposed in the single resonating chamber; and
   a tap, the tap being disposed along the length of the single resonating chamber.

2. The wideband small-scale cavity oscillator, as defined by claim 1, wherein the cavity oscillator is representable below a cutoff frequency by an equivalent circuit comprising a combination of lumped inductances.

3. The wideband small-scale cavity oscillator, as defined by claim 2, wherein the equivalent circuit comprises a plurality of quarter-wavelength sections, each of the quarter-wavelength sections comprising a series inductance and a plurality of shunt inductances.

4. The wideband small-scale cavity oscillator, as defined by claim 2, wherein the equivalent circuit comprises resonant conditions represented by $$B = B_0(coth\gamma l_1 + coth\gamma l_2) \quad (1),$$

wherein l represents a length of the single resonating chamber, $\gamma$ represents a complex propagation constant, B represents a shunt susceptance, and B0 represents a characteristic susceptance.

5. The wideband small-scale cavity oscillator, as defined by claim 4, wherein equation (1) is approximated by $$B = 2B_0 \quad (2)$$

if lengths of the plurality of quarter-wavelength sections are equal.

6. The wideband small-scale cavity oscillator, as defined by claim 3, wherein a value of at least on of the series inductance and the plurality of shunt inductances is determined by determining a characteristic impedance of the plurality of quarter-wavelength sections using $$Z_0 = \frac{j120\pi b}{a\left(\sqrt{\frac{\lambda}{\lambda_c}}\right)^2 - 1} = \frac{1}{B_0}, \quad (3)$$

wherein a represents the width of the single resonating chamber, b represents the height of the single resonating chamber, $\lambda$ represents a free-space wavelength, and $\lambda_c$ represents a cutoff wavelength.

7. The wideband small-scale cavity oscillator, as defined by claim 3, wherein the negative resistance diode is represented by at least one of the plurality of shunt inductances which resonates with the plurality of quarter-wavelength sections.

8. The wideband small-scale cavity oscillator, as defined by claim 1, wherein the at least one capacitive waveguide obstacle is at least one of passive and active.

9. The wideband small-scale cavity oscillator, as defined by claim 1, wherein the at least one capacitive waveguide obstacle comprises at least one of a tuning screw and varactor diode disposed through the single resonating chamber.

10. The wideband small-scale cavity oscillator, as defined by claim 1, wherein the tap comprises a wire output coupler.

11. The wideband small-scale cavity oscillator, as defined by claim 1, wherein the tap is centrally disposed along the length of the single resonating chamber.

12. The wideband small-scale cavity oscillator, as defined by claim 1, wherein the single resonating chamber is evanescent.

13. A method of manufacturing a wideband small-scale cavity oscillator comprising:
   providing a single resonating chamber, the single resonating chamber comprising a length, width, and height, the length being greater than the width, the length being greater than the height;
   disposing a negative resistance diode centrally in the single resonating chamber;
   disposing at least one capacitive waveguide obstacle in the single resonating chamber; and
   disposing a tap along the length of the single resonating chamber.

14. The method of manufacturing a wideband small-scale cavity oscillator, as defined by claim 13, further comprising representing the cavity oscillator is below a cutoff frequency by an equivalent circuit comprising a combination of lumped inductances.

15. The method of manufacturing a wideband small-scale cavity oscillator, as defined by claim 14, wherein the equivalent circuit comprises a plurality of quarter-wavelength sections, each of the quarter-wavelength sections comprising a series inductance and a plurality of shunt inductances.

16. The method of manufacturing a wideband small-scale cavity oscillator, as defined by claim 14, further comprising representing resonant conditions associated with the equivalent circuit by $$B = B_0(coth\gamma l_1 + coth\gamma l_2) \quad (1),$$

wherein l represents a length of the single resonating chamber, $\gamma$ represents a complex propagation constant, B represents a shunt susceptance, and B0 represents a characteristic susceptance.

17. The method of manufacturing a wideband small-scale cavity oscillator, as defined by claim 16, further comprising approximating equation (1) by $$B = 2B_0 \quad (2)$$

if lengths of the plurality of quarter-wavelength sections are equal.

18. The method of manufacturing a wideband small-scale cavity oscillator, as defined by claim 15, further comprising determining a value of at least one of the series inductance and the plurality of shunt inductances by determining a characteristic impedance of the quarter-wavelength waveguide sections using $$Z_0 = \frac{j120\pi b}{a\left(\sqrt{\frac{\lambda}{\lambda_c}}\right)^2} - 1 = \frac{1}{B_0}, \tag{3}$$

wherein a represents the width of the single resonating chamber, b represents the height of the single resonating chamber, $\lambda$ represents a free-space wavelength, and $\lambda_c$ represents a cutoff wavelength.

19. The method of manufacturing a wideband small-scale cavity oscillator, as defined by claim 15, further comprising representing the negative resistance diode by at least one of the plurality of shunt inductances which resonates with the plurality of quarter-wavelength sections.

20. The method of manufacturing a wideband small-scale cavity oscillator, as defined by claim 13, further comprising disposing at least one of a tuning screw and varactor diode through the single resonating chamber, the at least one of a tuning screw and varactor diode being configured to tune the at least one capacitive waveguide obstacle.

21. The method of manufacturing a wideband small-scale cavity oscillator, as defined by claim 13, further comprising disposing the tap centrally along the length of the single resonating chamber.

* * * * *